United States Patent [19]

Kopp

[11] Patent Number: 4,739,269
[45] Date of Patent: Apr. 19, 1988

[54] ORBIT ANTENNA FOR A NUCLEAR MAGNETIC RESONANCE (NMR) IMAGING APPARATUS

[75] Inventor: Jean P. Kopp, Montigny le Bretonneux, France

[73] Assignee: Thomson-CGR, Paris, France

[21] Appl. No.: 406

[22] Filed: Jan. 5, 1987

[30] Foreign Application Priority Data

Jan. 7, 1986 [FR] France ............................. 86 00140

[51] Int. Cl.⁴ ......................................... G01R 33/20
[52] U.S. Cl. .................... 324/318; 128/653; 324/322
[58] Field of Search ............. 324/307, 309, 311, 318, 324/322, 301, 72, 72.5, 95, 326, 327, 328, 329; 336/225, 226, 228, 232; 333/227, 231, 235; 343/741, 742, 743, 866, 867; 128/653

[56] References Cited

U.S. PATENT DOCUMENTS

| | | | |
|---|---|---|---|
| 2,550,607 | 4/1951 | Shoemaker | 324/327 |
| 2,999,977 | 9/1961 | Brown | 324/322 |
| 2,999,978 | 9/1961 | Pinkley | 324/322 |
| 4,528,509 | 7/1985 | Radda et al. | 324/318 |
| 4,636,730 | 1/1987 | Bottomley | 324/322 |

FOREIGN PATENT DOCUMENTS 0142077 5/1985 European Pat. Off. .

Primary Examiner—Michael J. Tokar
Assistant Examiner—Kevin D. O'Shea
Attorney, Agent, or Firm—Oblon, Fisher, Spivak, McClelland & Maier

[57] ABSTRACT

An orbit antenna for a nuclear magnetic resonance (NMR) imaging apparatus is symmetrized by joining together two concentric conductive loops in series. The antenna is frequency-tuned by a capacitor placed in parallel between the non-interconnected ends of the loops. A receiving circuit having a high input impedance is connected between the midpoint of the loops and one of the capacitor terminals. It is thus shown that the antenna is not unbalanced and endows the received signal with all the advantages of symmetrized antennas.

6 Claims, 2 Drawing Sheets

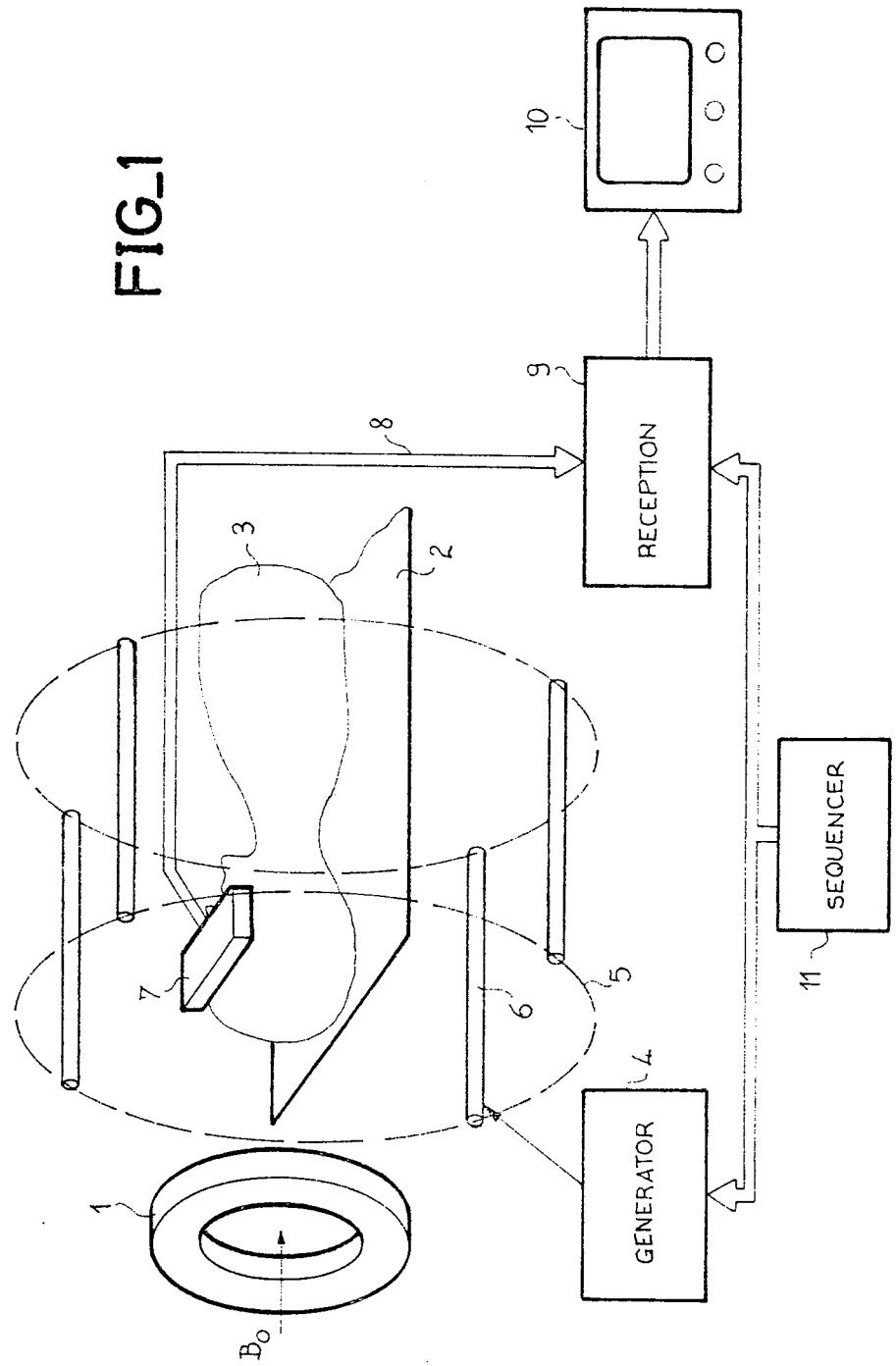

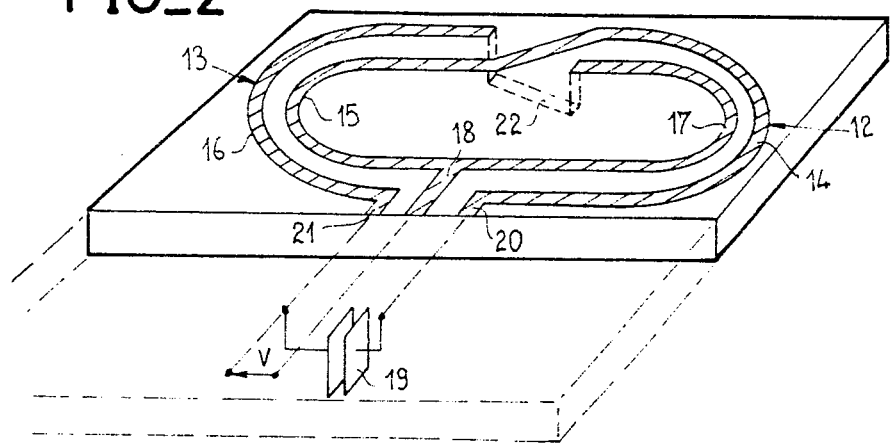
FIG_2
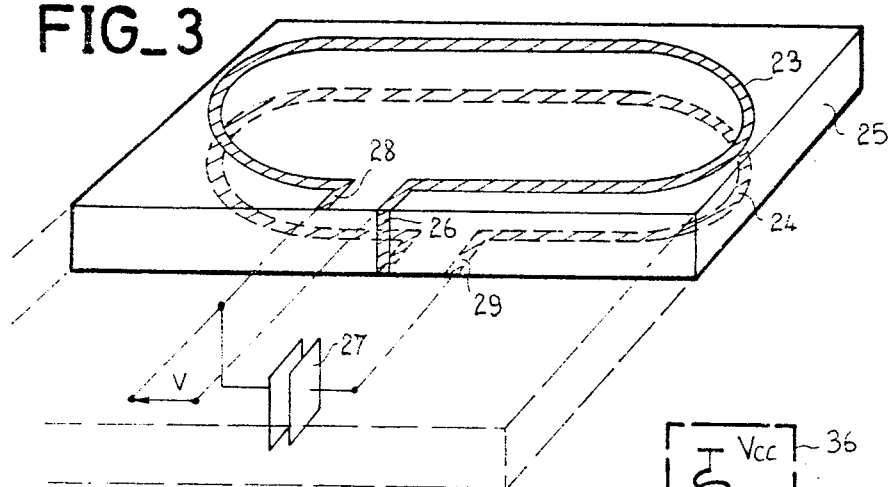
FIG_3
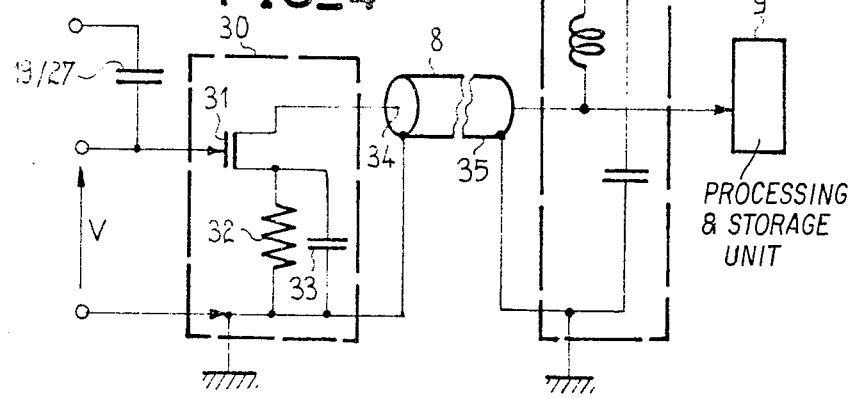
FIG_4

ORBIT ANTENNA FOR A NUCLEAR MAGNETIC RESONANCE (NMR) IMAGING APPARATUS

BACKGROUND OF THE INVENTION

1. Field of the Invention

The present invention relates to an orbit antenna for a nuclear magnetic resonance (NMR) imaging apparatus. Although a key application of the antenna is in the medical field for examination of patients' eyes, the invention is also useful for viewing different body locations when the part or organ to be examined is of small size.

2. Description of the Prior Art

In an NMR imaging device, a body to be examined is subjected to a constant high-strength magnetic field $B_O$. A radiofrequency excitation is additionally applied to the patient's body when it is under the influence of this field, thereby inducing resonance of oscillation of magnetic moments of particles within the body. After excitation, a measurement is performed on the resonance signal emitted as feedback by the particles when their magnetic moments tend to re-align themselves with the field $B_O$. The measured signal is processed in order to extract therefrom cross-sectional images of tissues or organs under examination.

The antenna in accordance with the invention has the essential function of collecting or detecting the resonance signal to be measured and is of the so-called surface type. Surface antennas are receiving antennas which are placed on the bodies to be examined. They are different from the transmitting antennas which are usually attached to the imaging apparatus itself. Since they are located in closer proximity to the body to be examined than antennas which are attached to the apparatus, surface antennas receive a signal which achieves a higher quality standard or signal-to-noise ratio. One of the main problems set by the construction of antennas lies in their symmetrization. This means that all parts of the antenna have to make an equal contribution to formation of the detected signal. It is a known fact that, if the antenna is unsymmetrical, it receives objectionable noise signals which are external to the body to be examined.

The known solutions of symmetrization of antennas involve the use of magnetic coupling devices which are known in other technical fields and serve to balance the contributions of the different portions of the antenna to formation of the detected signal. Unfortunately, the presence of ferromagnetic materials is prohibited in an NMR device. In practice, uniform distribution of magnetic fields in a device of this type is a strict requirement which governs the quality and fidelity of images. Moreover, the magnetic couplings produced by the devices mentioned above have another function, namely that of matching the impedance of the antenna with the impedance of a high-frequency line which serves to carry the detected signal. The problem to be solved is therefore that of replacing these couplings by other means.

SUMMARY OF THE INVENTION

The precise aim of the present invention is to propose symmetrized surface antennas provided with an impedance-matching circuit which is specifically studied and well-suited for the imaging of small regions which primarily include the human eye.

The invention relates to an orbit antenna for an NMR imaging apparatus, wherein said antenna comprises:
an even number of concentric conductive loops in series,
a tuning capacitor placed in parallel between the non-interconnected ends of said loops,
a high input-impedance receiving circuit connected between the midpoint of the loops and one of the terminals of the capacitor.

BRIEF DESCRIPTION OF THE DRAWINGS

FIG. 1 illustrates an NMR imaging apparatus equipped with an antenna in accordance with the invention.

FIG. 2 and FIG. 3 illustrate two examples of construction of an orbit antenna in accordance with the invention.

FIG. 4 illustrates a preferred example of construction of an impedance-matching circuit.

DESCRIPTION OF THE PREFERRED EMBODIMENTS

The NMR imaging apparatus shown in FIG. 1 includes a unit 1 for producing a constant high-strength magnetic field $B_O$. A table 2 is provided for supporting a patient 3 who is subjected to the influence of said magnetic field. A generator 4 produces radiofrequency excitation emitted by a transmitting antenna 5 which is provided, for example, with transmission rods such as the rod 6. The resonance signal is collected by an orbit antenna 7 which is placed for example above the eyes of the patient 3. This signal is directed via a high-frequency line 8 to a processing and storage unit 9. The unit 9 is connected to a display unit 10 for providing a visual representation of cross-sections of regions being examined. The generator 4 and processing unit 9 are controlled by a sequencer 11. The antenna 7 is symmetrized and matched. Signal detection by this antenna is carried out in accordance with the invention by means of an even-numbered arrangement of concentric conductive loops.

FIGS. 2 and 3 show examples of such arrangements in which the even number has a value of 2. The even number can be proportionally higher as the regions to be imaged are smaller, as the resonance frequency of the received signal is lower (low-strength field $B_O$) and, more generally, as the inductances of the loops are of lower value. As shown in FIG. 2, two concentric loops 12 and 13 are located in the same plane in intercrossed relation, each loop being constituted by an outer arc and an inner arc designated respectively by the references 14, 15 and 16, 17. The midpoint 18 of the loops corresponds to connection of the two inner arcs. The antenna is provided with a capacitor 19 placed in parallel between the non-interconnected ends 20 and 21 respectively of the loops 12 and 13. A receiving circuit having a high input impedance is connected (V) between the midpoint 18 of the loops and one of the terminals of the capacitor 19 such as the terminal 21, for example. Intercrossing of the loops 12 and 13 is arranged by means of a bridge 22 which permits crossover of the outer arcs and inner arcs of each loop. An insulating layer is interposed at the location of the bridge 22 between the conductors of each loop. The antenna has the general shape of an ellipse or of a circle if so required. The midpoint 18 and the bridge 22 are in diametrically opposite relation along an axis of symmetry of said antenna. The loops are supported by a base plate 25. Said base plate can be of printed-circuit material in which the loops have been etched.

FIG. 3 is another representation of the antenna in which two coaxial loops 23, 24 are placed on each side of an insulating base plate 25. In this embodiment, the insulating support can be a base for a double-face printed circuit. The loops 23 and 24 are in series with respect to each other and are joined together at their midpoint 26 by means of a connection which extends through the base plate 25. A capacitor 27 is connected in parallel between the non-interconnected ends 28 and 29 of the loops 23 and 24 respectively. The receiver is connected between the midpoint 26 and one of the terminals of the capacitor 27 such as the terminal 28, for example. The presence of the capacitor 19 in the case of FIG. 2 and of the capacitor 27 in the embodiment under consideration is justified by the usefulness of an oscillating circuit having a high Q factor at the resonance frequency of the signal to be measured. In one case as in the other, the relation of the loops provides an additional distributed capacitance by virtue of the oppositely-facing arrangement of the conductor surfaces of said loops and this additional capacitance has the effect of enhancing the efficiency of the Q-tuning capacitors. It is worthy of note that, in both cases, frequency tuning is performed by means of a single capacitor. The existence of this single capacitor makes it possible to solve another problem, namely that of having to determine only one element. A known practice adopted for reducing the reception of dielectric noise signals produced within the body 3 consists in placing tuning capacitors at different points of the detection loop. For adjustment purposes, it is accordingly necessary to ensure that the capacitors thus chosen are all adjusted. With a single capacitor, this problem is simplified. Reception of noise is also reduced in this case since the capacitor adds its own influence to each of the two receiving loops at the same time.

The need for antenna-matching adjustment is suppressed by means of an active receiving circuit 30. The presence of the patient does not modify the tuning frequency. High tolerance of input impedance with respect to the noise factor is accordingly achieved in this case. The frequency tuning adjustment is therefore alone sufficient.

FIG. 4 shows a preferred example of construction of the receiving circuit 30 which is cascade-connected between the midpoints of the loops and one of the terminals of the tuning capacitor. Said receiving circuit 30 has a high input impedance in order to prevent unbalance of the antenna. In fact, in both cases, one of the loops is loaded by an open circuit having an infinite impedance (loop 12 and loop 24) whereas the other circuit is loaded by the receiver. Since the input impedance of this latter is of high value, there is no unbalance. The receiving circuit 30 essentially includes a field-effect transistor (FET) 31 mounted with a common emitter connection through a bias resistor 32 and through a decoupling capacitor 33. The transistor 31 receives the detected signal on its gate and transmits the amplified signal to the central conductor 34 of a coaxial cable 35 which forms the high-frequency line 8 (as shown in FIG. 1). The circuit 30 therefore achieves impedance matching of the antenna. A supply circuit 36 permits application of a bias voltage $V_{cc}$ to the transistor 31, also through the central conductor 34. The supply circuit 36 is of known type and can be decoupled from the signal to be measured. The signal which is received and amplified by the circuit 30 is thus transmitted to the processing unit 9. From a mechanical standpoint, the antennas can be formed on printed circuits which may or may not be flexible, the complete assembly being encapsulated in flexible resin. The amplifying and matching circuit 30 is preferably formed on the same base in immediate proximity to the antenna.

FIG. 4 again shows the capacitor 19 (or 27) placed between the ends of the loops. The conditions of resonance and quality factor are defined for a capacitance corresponding to the sum of the distributed capacitance, of the capacitance 19 (or 27), and of the input capacitance of the equivalent alternating-current circuit of the amplifier 30.

What is claimed is:

1. An orbit antenna for a nuclear magnetic resonance (NMR) imaging apparatus, wherein said antenna comprises:
   an even number of coaxial conductive loops in series having at least two non-interconnected ends,
   a tuning capacitor placed in parallel between the non-interconnected ends of said loops,
   a high input-impedance receiving circuit connected between the midpoint of the loops and one of the terminals of the capacitor.

2. An antenna according to claim 1, wherein the even number has a value of 2.

3. An antenna according to claim 2, wherein the two loops are located in the same plane in intercrossed relation, each loop being constituted by an outer arc and an inner arc, the midpoint of the loops being at a location corresponding to the connection of the two inner arcs.

4. An antenna according to claim 2, wherein the loops are superposed and located in register on each side of a base plate.

5. An antenna according to claim 1, wherein the receiving circuit includes a field-effect transistor mounted with a common emitter.

6. An antenna according to claim 5, wherein current is supplied to the field-effect transistor from a supply circuit which is decoupled from the received signal via the central conductor of a coaxial cable constituting a high-frequency line for connecting the receiving circuit to a processing unit of the imaging apparatus.

* * * * *